(12) United States Patent
Wu

(10) Patent No.: US 7,710,207 B2
(45) Date of Patent: May 4, 2010

(54) VOLTAGE CONTROLLED OSCILLATOR WITH IMPROVED VOLTAGE OSCILLATION FREQUENCY CHARACTERISTIC

(75) Inventor: Ching-Yen Wu, Taipei Hsien (TW)

(73) Assignee: VIA Technologies Inc., Hsin-Tien, Taipei Hsien (TW)

( * ) Notice: Subject to any disclaimer, the term of this patent is extended or adjusted under 35 U.S.C. 154(b) by 683 days.

(21) Appl. No.: 11/557,109

(22) Filed: Nov. 7, 2006

(65) Prior Publication Data

US 2007/0103242 A1 May 10, 2007

(30) Foreign Application Priority Data

Nov. 9, 2005 (TW) ............................... 94139268 A

(51) Int. Cl.
*H03B 27/00* (2006.01)
(52) U.S. Cl. .......................... 331/57; 331/183; 331/186; 331/175; 331/16
(58) Field of Classification Search .................... 331/57, 331/16, 177 R, 185, 183, 186, 175
See application file for complete search history.

(56) References Cited

U.S. PATENT DOCUMENTS

| 5,767,748 A | | 6/1998 | Nakao |
| 5,847,616 A | * | 12/1998 | Ng et al. ...................... 331/57 |
| 6,011,443 A | | 1/2000 | Chen |
| 6,094,103 A | * | 7/2000 | Jeong et al. ................... 331/57 |

FOREIGN PATENT DOCUMENTS

| CN | 1190285 A | 8/1998 |
| CN | 1494212 A | 5/2004 |
| CN | 1627628 A | 6/2005 |
| TW | 565842 | 12/2003 |
| TW | 569540 | 1/2004 |

* cited by examiner

*Primary Examiner*—Arnold Kinkead
(74) *Attorney, Agent, or Firm*—Winston Hsu

(57) ABSTRACT

A voltage controlled oscillator (VCO) with improved frequency characteristics is provided. The VCO includes a converting circuit supplied between a bias voltage and a ground voltage for converting the control voltage into a control current, a replica bias circuit coupled to the converting circuit for providing a swing voltage, and a ring oscillating circuit coupled to the replica bias circuit having at least two delay units coupled in series for successively delaying an input signal as the oscillating signal after a period of delay time.

24 Claims, 3 Drawing Sheets

VOLTAGE CONTROLLED OSCILLATOR WITH IMPROVED VOLTAGE OSCILLATION FREQUENCY CHARACTERISTIC

BACKGROUND OF THE INVENTION

1. Field of the Invention

The present invention relates to voltage-controlled oscillators (VCO), and more particularly, the present invention relates to a VCO that provides an improved voltage-oscillation frequency characteristic, and a related method.

2. Description of the Prior Art

In a modern information society, all kinds of knowledge, information, documents, statistics, and multimedia files are rapidly transferred, processed, managed, and stored by use of digital signals, and all kinds of corresponding digital circuits have become an important foundation for the modern information society.

As one of ordinary skill in the art would know, a phase-locked loop is widely used in many circuits, such as wired/wireless communications circuits, signal processing circuits, and even clock control sequential circuits/processors. Therefore, a stable voltage-controlled oscillator (VCO) in the PLL is a serious designed consideration.

The VCO generates an oscillating signal (or clock) with a frequency corresponding to an input voltage. In a poor VCO design, jitter affects the stability of the VCO and should be overcome.

SUMMARY OF THE INVENTION

The present invention provides a voltage controlled oscillator (VCO) with improved frequency characteristics, and a related technique. The VCO has reduced device drift and reduced jitter which protects the VCO from performance instability.

The VCO of the present invention includes a conversion circuit supplied between a bias voltage and a ground voltage for converting the control voltage into a control current, a replica bias circuit connected to the converting circuit for providing a swing voltage, and a ring oscillating circuit connected to the replica bias circuit having at least one delay unit connected in series for successively delaying an input signal as the oscillating signal after a period of delay time, wherein each delay unit has two differential input ends and two differential output ends. The replica bias circuit adjusts a supply voltage applied to the ring oscillating circuit to determine the period of delay time according to the control current and the swing voltage.

The method for providing an oscillating signal according to a control voltage in the present invention includes converting the control voltage to a control current according to a reference impedance, providing a swing voltage according to a reference current, and delaying an input signal for a period of delay time for outputting the oscillating signal. The period of delay time is determined by the control current and the swing voltage.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
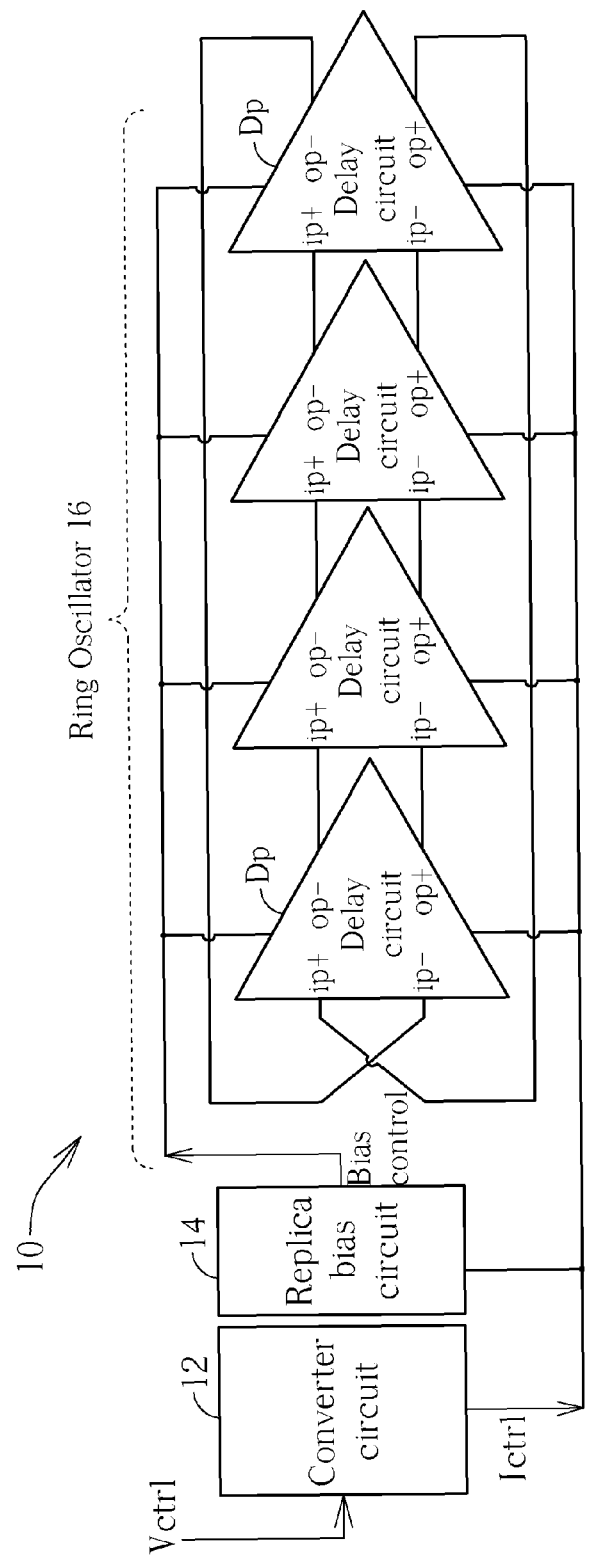
FIG. 1 is a block diagram of a VCO according to the prior art.

FIG. 1 shows a functional block diagram of a VCO 10 according to the present invention. The VCO 10 generates an oscillating signal with a frequency proportional to a control voltage Vctrl. The VCO 10 includes: a linear converting circuit 12 with a current subtraction architecture, a replica bias circuit 14 for providing a swing voltage and compensating for a device drift, and a ring oscillator 16 for successively delaying an input signal and heavily driving current to provide the oscillating signal.

The linear converting circuit 12 converts a control voltage Vctrl into a corresponding control current Ictrl. The replica bias circuit 14 provides a supply voltage applied to the ring oscillator 16 according to the control current Ictrl and a swing voltage Vsw. The ring oscillator 16 includes a plurality of delay units D successively connected as a ring (as shown in FIG. 1, a ring of four delay circuits is taken as an example). The number of delay circuits in the ring is not limited to four, and could be reduced or increased for different design requirements. Each delay unit D includes two differential input ends ip+ and ip− for respectively receiving differential input signals, and two differential output ends op− and op+ for respectively outputting differential output signals. When an input signal, e.g. a voltage level, is changed at either of the two input ends, the delay unit D provides a corresponding output signal at the corresponding output end after a period of delay time. In the invention, the period of delay time is determined by the supply voltage applied to the ring oscillator 16 from the replica bias circuit 14. After the successive delaying, the oscillating signal is provided by the VCO 10.

Figure 2:
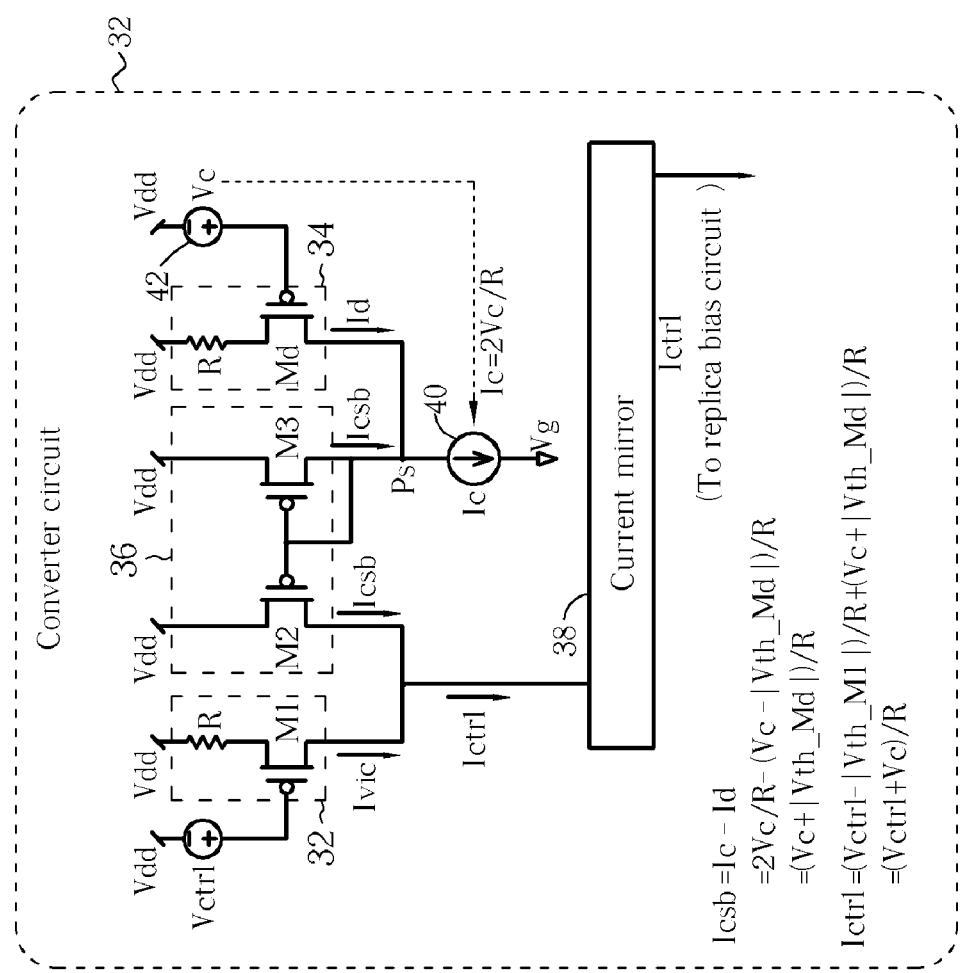
FIG. 2 is a schematic of the circuit of the present invention.
Figure 3:
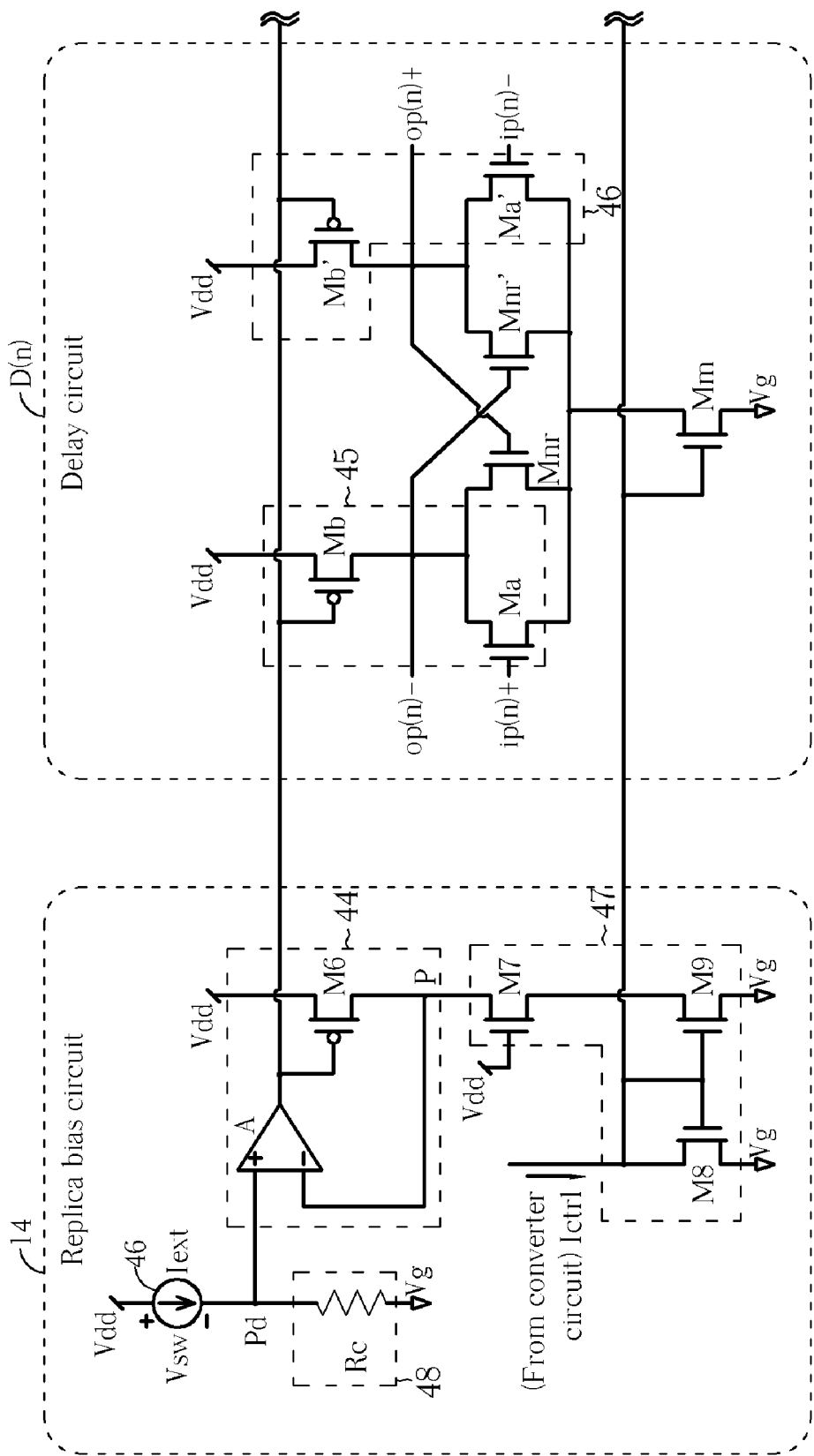
FIG. 3 is a schematic of the circuit of the present invention.

Please refer to FIG. 2 and FIG. 3, which show schematics of the circuits described in FIG. 1. FIG. 2 is a schematic of the linear converting circuit 12; FIG. 3 is a schematic of the replica bias circuit 14 and one delay unit D in the ring oscillator 16.

The circuits shown in FIG. 2 and FIG. 3 are biased between a bias voltage Vdd and a ground voltage Vg.

In FIG. 2, the linear converting circuit 12 of the present invention is shown. The linear converting circuit 12 includes four PMOS transistors M1, M2, M3 and Md. Sources of two transistors M1 and Md are respectively coupled to impedance-matched reference resistances with a value of R. In the invention, the transistor M1 and the coupled reference resistance are regarded as a first source-degenerated device 32; the transistor Md and the coupled reference resistance are regarded as a second source-degenerated device 34; and the combination of the transistors M2 and M3 is regarded as a current mirror 36. A gate of the transistor M1 receives the control voltage Vctrl, and as a result, a conducting current Ivic of the transistor M1 is equal to (Vctrl−|Vth_M1|)/R, wherein Vth_M1 is a threshold voltage of the transistor M1. A gate of the transistor Md receives a constant voltage Vc from a voltage source 42 (the voltage source could be implemented by a bandgap circuit to compensate for the device drift characteristics). Therefore, a conducting current Id of the transistor Md is equal to (Vc−|Vth_Md|)/R, wherein Vth_Md is a threshold voltage of the transistor Md. In an appropriate layout design, the threshold voltages Vth_M1 and Vth_Md are substantially the same.

The conducting current Id of the transistor Md flows into a node Ps which is coupled to a current source 40 providing a constant current Ic according to the constant voltage Vc. As a result, the current Ic is equal to 2Vc/R. Therefore, a branch current Icsb of the node Ps from a transistor M3 is equal to (Ic−Id), which results in a current subtraction architecture.

Due to a relationship of the constant current Ic and the constant voltage Vc, the current Icsb is expressed as:

$Icsb=2*Vc/R-(Vc-|Vth\_Md|)/R=(Vc+|Vth\_Md|)/R$

In addition, the matching PMOS transistors M2, M3 are regarded as the current mirror 36. Therefore, the current Icsb from the transistor M3 is married to the transistor M2. As a result, the control current Ictrl is combined with the current Ivic from the transistor M1 and the current Icsb. Thus, the control current Ictrl is expressed as:

$Ictrl=Ivic+Icsb$ $=(Vctrl-|Vth\_M1|)/R+(Vc+Vth\_Md)/R=(Vctrl+Vc)/R.$

From the expression above, the relationship of the control voltage Vctrl and the control current Ictrl in the converting circuit 12 is linear, independent of threshold voltage. The control current Ictrl is then transmitted to the replica bias circuit 34 by an output circuit such as a current mirror 38 shown in FIG. 2.

Please refer to FIG. 3, which respectively shows a schematic of the replica bias circuit 14 and one of the delay units D(n) in the ring oscillator 16 of FIG. 1. In FIG. 3, one delay unit D(n) is shown as an example to represent an n-th delay unit in the ring oscillator 16.

The delay unit D(n) includes two matching NMOS transistors Ma and Ma', and two matching PMOS transistors Mb and Mb'. The transistors Ma and Mb are regarded as an inverting circuit 45; and the transistors Ma' and Mb' are regarded as another inverting circuit 46. The gate of the transistor Ma is the positive input end ip(n)+ of the delay unit D(n), and the gate of the transistor Ma' is the negative input end ip(n)− of the delay unit D(n). The drain of the transistor Mb is the negative output end op(n)− of the delay unit D(n), and the drain of the transistor Mb' is the positive output end op(n)+ of the delay unit D(n). Two sources of the transistors Mb and Mb' are respectively coupled to the bias voltage Vdd, and two sources of the transistors Ma and Ma' are respectively coupled in series to an NMOS transistor Mm.

In the present invention, the delay unit D(n) further includes two matching NMOS transistors Mnr and Mnr' for respectively providing negative resistance units of the two inverting circuits 45 and 46 to improve the voltage-frequency characteristic. The transistor Mnr is back-connected to the transistor Ma, and the transistor Mnr' is back-connected to the transistor Ma'. A gate of the transistor Mnr and a drain of the transistor Mnr' are respectively coupled to the positive output end op(n)+ of the delay unit D(n). A gate of the transistor Mnr' and a drain of the transistor Mnr are respectively coupled to the negative output end op(n)− of the delay unit D(n). According to the voltage of the output ends op(n)+ and op(n)−, the transistors Mnr and Mnr' are respectively determined to be turned on or turned off.

In the present invention, assume the ring oscillator 16 has N delay units D(0)~D(N−1) coupled successively, the coupling condition is as follows. Taking the n-th delay unit as an example, the negative output end op(n)− is connected to the positive input end ip(n+1)+ of the next delay unit D(n+1); the positive output end op(n)+ is connected to the negative input end ip(n+1)− of the next delay unit D(n+1). If N is even, the positive output end op(N−1)+ of the last delay unit D(N−1) is coupled back to the positive input end ip(0)+ of the first delay unit D(0); and, the negative output end op(N−1)− of the last delay unit D(N−1) is coupled back to the negative input end ip(0)− of the first delay unit D(0). If N is odd, the positive output end op(N−1)+ of the last delay unit D(N−1) is coupled back to the negative input end ip(0)− of the first delay unit D(0); and, the negative output end op(N−1)− of the last delay unit D(N−1) is coupled back to the positive input end ip(0)+ of the first delay unit D(0). After the successive oscillating, any output signal from any of the output ends of the delay units could be regarded as the oscillating signal.

The replica bias circuit 14 shown in FIG. 3 includes three NMOS transistors M7, M8 and M9, which form a mirror circuit 47 in combination with the transistor Mm in each delay unit. Thus, the control current Ictrl flowing through the transistor M8 from the converting circuit 12 is married to the transistor M9 and each transistor Mm of each delay unit.

The replica bias circuit 14 also has a feedback circuit 44 which includes a matching PMOS transistor M6 and an amplifier A (the amplifier A can be implemented as a high-gain differential amplifier). The amplifier A controls the gate voltage of the transistor M6 in the replica bias circuit 14 and the gate voltage of the transistors Mb and Mb' in the delay unit according to a voltage difference across the node Pd and the node P. Because the transistor M6 conducts the control current Ictrl, as a result, the voltage of the node P (Vp) is maintained equal to the voltage of node Pd (Vpd).

To improve the voltage-frequency characteristic, the replica bias circuit 14 of the present invention further includes a loading unit 48 which may be implemented by a compensating damper resistance with a value of Rc. As shown in FIG. 3, the replica bias circuit 14 also includes a current source 46 (the current source could be implemented by a bandgap circuit or an external resistance for compensating the device drift characteristics) for providing a constant current Iext which is regarded as a reference current. As the constant current Iext flows through the loading unit 48 (i.e. the compensating damper resistance), the voltage drop is generated (i.e. Vpd=Iext*Rc). As a result, the voltage difference between the bias voltage Vdd and the loading voltage Vpd is regarded as the swing voltage Vsw (i.e. Vsw=Vdd−Vpd=Vdd−Iext*Rc) of the replica bias circuit 14. Under the operation of the amplifier A and the transistor M6, the voltage of the node P (Vp) is maintained as (Vdd−Vsw), i.e. Vp=Vpd=Vdd−Vsw.

The operation of the delay circuit D(n) of the present invention in combination with the converting circuit 12, the replica bias circuit 14, and the ring oscillator 36 is described as follows.

Assume an input signal at the positive input ip(n)+ is changed from a low level to a high level, and the input signal at the negative input ip(n)− is simultaneously changed from the high level to the low level. The transistor Ma is turned on and the control current Ictrl mirrored to the transistor Mm turns on the transistor M. Furthermore, due to the control of the amplifier A, the voltage of the negative output end op(n)− rapidly decreases from Vdd to (Vdd−Vsw) after a period of delay time. In the present invention, the voltage (Vdd−Vsw) is defined as the low level of the oscillating signal. The period of delay time is substantially equal to a period required to discharge the equivalent capacitance of the negative output end op(n)− to the level of the swing voltage Vsw by the control current Ictrl. Thus, the period of delay time is proportional to the control current Ictrl and is inversely proportional to the swing voltage Vsw.

In addition, the transistor Ma' is turned off due to the low level of the negative input end ip(n)−, and the equivalent capacitance at the positive output end op(n)+ is charged to the bias voltage Vdd by the transistor Mb' after the period of delay time. In the present invention, the bias voltage Vdd is defined as the high level of the oscillating signal.

During the voltage level transition of the positive output end op(n)+ and the negative input end op(n)−, the transistor Mnr also conducts due to the high level at the positive output end op(n)+ which helps the transistor Ma to discharge the equivalent capacitance of the negative output end op(n)−. Therefore, the voltage of the negative output end op(n)− discharges more rapidly to the swing voltage Vsw.

It should be noticed that, in the present invention, when the transistor Mnr conducts, a negative resistance is provided to decrease to effect of the parasitic resistance of the negative output end op(n)−. Therefore, the voltage of the negative output end op(n)− can change more rapidly to provide the better voltage-frequency characteristic at a high oscillating frequency. Otherwise, when the transistor Ma' is turned off, the transistor Mnr' is also turned off due to the low level of the negative output end op(n)−.

Therefore, the oscillating signal is generated due to the successive delaying in each delay unit in the ring oscillator 16. The cycle of the oscillating signal is proportional to the period of delay time of each delay unit. Thus, the oscillating frequency f is expressed as:

$$f=Ictrl/(N*Ceff*Vsw)$$

wherein N is the number of delay units D in the ring oscillator 16; Ceff is the equivalent capacitance at the output end of the delay units (including the parasitic capacitances coupled to the output end). As described above, the oscillating frequency f is also expressed as:

$$f=(Vctrl+Vc)/(N*Ceff*R*Vsw)$$

From the equation of f described above, it should be noticed that the oscillating frequency f is linearly dependent on the control voltage Vctrl, which results in less jitter in the stable VCO. Additionally, the voltage-frequency characteristic in the present invention does not vary widely due to the device drift. It can also be seen that, since the effect of the threshold voltage is also eliminated in the present invention, the voltage-frequency characteristic is only affected by the product (R*Vsw). In the present invention, the product (R*Vsw) is controlled to compensate for the device drift.

As the described above, the stable VCO with less jitter and less susceptibility to device drift is provided in the present invention to have the better voltage-frequency characteristic.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A voltage controlled oscillator for providing an oscillating signal according to a control voltage, the voltage controlled oscillator comprising:
    a converting circuit supplied between a bias voltage and a ground voltage for converting the control voltage into a control current, wherein the converting circuit comprises:
        a first source degenerating device, wherein the control voltage is applied to the first source degenerating device for generating a first conducting current;
        a second source degenerating device, wherein a constant voltage is provided to the second source degenerating device for generating a second conducting current;
        a first current mirror coupled between the first source degenerating device and the second source degenerating device for generating a third conducting current; and
        a first current source coupled to the second source degenerating device, the first current mirror and the ground voltage for providing a first reference current;
    a replica bias circuit coupled to the converting circuit for providing a swing voltage; and
    a ring oscillating circuit coupled to the replica bias circuit comprising at least two delay units coupled in series for successively delaying an input signal as the oscillating signal after a period of delay time, wherein each delay unit has two differential input ends and two differential output ends;
    wherein the replica bias circuit adjusts a supply voltage applied to the ring oscillating circuit to determine the period of delay time according to the control current and the swing voltage.

2. The voltage controlled oscillator of claim 1, wherein the first source degenerating device comprises:
    a first transistor and a first reference resistance, wherein the first reference resistance is coupled between the source of the first transistor and the bias voltage, and the control voltage is inputted to the gate of the first transistor for generating the first conducting current at the drain of the first transistor;
    wherein the second source degenerating device comprises:
    a second transistor and a second reference resistance, wherein the second reference resistance is coupled between the source of the second transistor and the bias voltage, and the constant voltage is inputted to the gate of the second transistor for generating the second conducting current at the drain of the second transistor.

3. The voltage controlled oscillator of claim 2, wherein the first reference current is twice the quotient of the constant voltage and the second reference resistance.

4. The voltage controlled oscillator of claim 2, wherein the first conducting current is substantially equal to the difference of a first threshold voltage of the first transistor subtracted from the control voltage divided by a value of a first reference resistance; wherein the second conducting current is substantially equal to the difference of a second threshold voltage of the second transistor subtracted from the constant voltage divided by the second resistance.

5. The voltage controlled oscillator of claim 4, wherein the first threshold voltage and the second threshold voltage are substantially the same, and the value of the first reference resistance and the value of the second reference resistance are substantially the same.

6. The voltage controlled oscillator of claim 2, wherein the swing voltage is complementary to the first reference resistance and the second reference resistance.

7. The voltage controlled oscillator of claim 3, wherein the first current mirror comprises:
    a third transistor and a fourth transistor;
    wherein the source of the third transistor and the source of the fourth transistor are respectively coupled to the bias voltage, the gate of the third transistor is coupled to the gate of the fourth transistor, the drain of the third transistor is coupled to the first source degenerating device, and the drain of the fourth transistor is coupled between the second source degenerating device and the first current source, and furthermore coupled to the gate of the third transistor and the gate of the fourth transistor;
    wherein the third conducting current is generated at the drain of the fourth transistor and the third conducting current is mirrored to the drain of the third transistor as a mirrored current.

8. The voltage controlled oscillator of claim 1, wherein the third conducting current is comprised of the first reference current less the second conducting current.

9. The voltage controlled oscillator of claim 1, wherein the control current is comprised of the sum of the first conducting current and the third conducting current.

10. The voltage controlled oscillator of claim 1, wherein the converting circuit further comprises an output circuit coupled to the first source degenerating device for outputting the control current to the replica bias circuit.

11. The voltage controlled oscillator of claim 10, wherein the output circuit is a second current mirror circuit.

12. The voltage controlled oscillator of claim 1, wherein the period of delay time is proportional to the control current and inversely proportional to the swing voltage.

13. The voltage controlled oscillator of claim 1, wherein the frequency of the oscillating signal is determined by the control current, the number of the delay units in the ring oscillator and the swing voltage.

14. The voltage controlled oscillator of claim 1, wherein the voltage controlled oscillator is applied to a phase-locked loop.

15. A voltage controlled oscillator for providing an oscillating signal according to a control voltage, the voltage controlled oscillator comprising:
- a converting circuit supplied between a bias voltage and a ground voltage for converting the control voltage into a control current;
- a replica bias circuit coupled to the converting circuit for providing a swing voltage; and
- a ring oscillating circuit coupled to the replica bias circuit comprising at least two delay units coupled in series for successively delaying an input signal as the oscillating signal after a period of delay time, wherein each delay unit comprises:
  - a first inverting circuit having a positive input end and a negative output end;
  - a second inverting circuit having a negative input end and a positive output end;
  - a first transistor, wherein the first inverting circuit and the second inverting circuit are respectively series coupled to the first transistor;
  - a first negative resistance unit coupled between the first inverting circuit, the positive output end, and the first transistor for rapidly changing the voltage level of the negative output end; and
  - a second negative resistance unit coupled between the second inverting circuit, the negative output end and the first transistor for rapidly changing the voltage level of the positive output end;
- wherein the replica bias circuit adjusts a supply voltage applied to the ring oscillating circuit to determine the period of delay time according to the control current and the swing voltage.

16. The voltage controlled oscillator of claim 15, wherein the first negative resistance unit and the second negative resistance unit are implemented as NMOS transistors.

17. A voltage controlled oscillator for providing an oscillating signal according to a control voltage, the voltage controlled oscillator comprising:
- a converting circuit supplied between a bias voltage and a ground voltage for converting the control voltage into a control current;
- a replica bias circuit coupled to the converting circuit for providing a swing voltage, wherein the replica bias circuit comprises
  - a first transistor receiving the control current from the converting circuit;
  - a second transistor; and
  - a third transistor; and
- a ring oscillating circuit coupled to the replica bias circuit comprising at least two delay units coupled in series for successively delaying an input signal as the oscillating signal after a period of delay time, wherein each delay unit comprises:
  - a first inverting circuit having a positive input end and a negative output end;
  - a second inverting circuit having a negative input end and a positive output end; and
  - a fourth transistor, wherein the first inverting circuit and the second inverting circuit are respectively series coupled to the fourth transistor;
- wherein the replica bias circuit adjusts a supply voltage applied to the ring oscillating circuit to determine the period of delay time according to the control current and the swing voltage;
- wherein the first transistor, the second transistor, and the third transistor of the replica bias circuit and the fourth transistor of the delay unit form a third current mirror for mirroring the control current from the first transistor to the delay unit.

18. The voltage controlled oscillator of claim 17, wherein the replica bias circuit further comprises:
- a feedback circuit coupled to a second current source, which provides a second reference current, via a first node, and coupled to the second transistor via a second node; and
- a loading unit coupled to the second current source and the feedback circuit for proving a voltage drop at the first node.

19. The voltage controlled oscillator of claim 18, wherein the swing voltage is substantially equal to the difference of the bias voltage and the voltage of the first node.

20. The voltage controlled oscillator of claim 18, wherein the supply voltage provided to the delay unit of the ring oscillator is substantially equal to the voltage difference of the first node and the second node.

21. The voltage controlled oscillator of claim 18, wherein the feedback circuit comprises:
- an amplifier and a fifth transistor;
- wherein the second reference current inputted to the loading unit is coupled to the positive input end of the amplifier, the output end of the amplifier is coupled to the gate of the fifth transistor, the source of the fifth transistor is coupled to the bias voltage, and the drain of the fifth transistor is fed back to the negative input end of the amplifier through the fourth node.

22. The voltage controlled oscillator of 21, wherein the first inverter of the delay unit comprises:
- a sixth transistor and a seventh transistor coupled in series;
- wherein the second inverter comprises an eighth transistor and a ninth transistor coupled in series;
- wherein the gate of the sixth transistor is the positive input end of the delay unit, the gate of the seventh transistor is the negative input end of the delay unit, the drain of the eighth transistor is the negative output end of the delay unit, the drain of the ninth transistor is the positive output end of the delay unit, and the source of the eighth transistor and the source of the ninth transistor are respectively coupled to the bias voltage, the drain of the sixth transistor is coupled to the negative output end, and the drain of the seventh transistor is coupled to the positive output end.

23. The voltage controlled oscillator of claim 22, wherein the amplifier adjusts the gate voltages of the fifth transistor, the eighth transistor and the ninth transistor according to the voltage difference of the first node and the second node; wherein when the conducting current of the fifth transistor is substantially equal to the control current, the voltage of the second node is substantially equal to the voltage of the first node.

24. The voltage controlled oscillator of claim 18, wherein the loading unit is a compensating damper resistance.

* * * * *